(12) United States Patent
Jembulingam et al.

(10) Patent No.: US 11,621,152 B2
(45) Date of Patent: *Apr. 4, 2023

(54) METHODS AND APPARATUS FOR PROCESSING A SUBSTRATE USING IMPROVED SHIELD CONFIGURATIONS

(71) Applicant: Applied Materials, Inc., Santa Clara, CA (US)

(72) Inventors: Soundarrajan Jembulingam, Bangalore (IN); Jian Janson Chen, Fremont, CA (US); Jeonghoon Oh, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/714,502

(22) Filed: Apr. 6, 2022

(65) Prior Publication Data
US 2022/0375735 A1 Nov. 24, 2022

Related U.S. Application Data

(63) Continuation of application No. 17/327,955, filed on May 24, 2021, now Pat. No. 11,508,563.

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01)

(58) Field of Classification Search
None
See application file for complete search history.

(56) References Cited

U.S. PATENT DOCUMENTS

| | | | |
|---|---|---|---|
| 5,512,102 A | 4/1996 | Yamazaki | |
| 5,744,016 A | 4/1998 | Yamada et al. | |
| 8,066,857 B2 * | 11/2011 | Li | C23C 14/08 204/298.14 |
| 8,268,142 B2 | 9/2012 | Weichart et al. | |
| 8,475,636 B2 | 7/2013 | Mayer et al. | |
| 10,692,706 B2 | 6/2020 | Ritchie et al. | |
| 11,508,563 B1 * | 11/2022 | Jembulingam | H01J 37/3441 |
| 2005/0039679 A1 | 2/2005 | Kleshock et al. | |
| 2005/0284372 A1 * | 12/2005 | Murugesh | C23C 16/4404 118/715 |
| 2006/0027327 A1 | 2/2006 | Sorensen et al. | |

(Continued)

FOREIGN PATENT DOCUMENTS

KR 10-2001-0054515 A 7/2001

OTHER PUBLICATIONS

International Search Report for PCT/US2022/027222, dated Aug. 17, 2022

*Primary Examiner* — Jason Berman
(74) *Attorney, Agent, or Firm* — Moser Taboada

(57) ABSTRACT

Methods and apparatus for processing a substrate using improved shield configurations are provided herein. For example, a process kit for use in a physical vapor deposition chamber comprises a shield comprising an inner wall comprising an upper portion having a first wavy fin configuration and a bottom portion having a second wavy fin configuration different from the first wavy fin configuration such that a surface area of the shield is about 1400 in$^2$ to about 1410 in$^2$.

16 Claims, 3 Drawing Sheets

(56) References Cited

U.S. PATENT DOCUMENTS

2010/0155238 A1    6/2010  Weichart et al.
2017/0316924 A1\*  11/2017  Cox .................... C23C 14/564
2020/0071832 A1    3/2020  Lau et al.
2020/0312640 A1  10/2020  Ritchie et al.

\* cited by examiner

METHODS AND APPARATUS FOR PROCESSING A SUBSTRATE USING IMPROVED SHIELD CONFIGURATIONS

CROSS-REFERENCE TO RELATED APPLICATIONS

The present application is a continuation application of U.S. patent application Ser. No. 17/327,955, filed on May 24, 2021, the entire contents of which is incorporated herein by reference.

FIELD

Embodiments of the present disclosure generally relate to a methods and apparatus for processing a substrate, and more particularly, to methods and apparatus for processing a substrate using improved shield configurations.

BACKGROUND

Magnitude of target self-bias can impact the sputtering rates of a target and an anode (e.g., shields, wafer, etc.) material. Commonly, higher negative self-bias on targets is obtained by using extremely wide body chambers, thus increasing the anode area. However, such an approach can lead to increased footprint of an PVD chamber.

SUMMARY

Methods and apparatus for processing a substrate using improved shield configurations are provided herein. In some embodiments, a process kit for use in a physical vapor deposition chamber comprises a shield comprising an inner wall comprising an upper portion having a first wavy fin configuration and a bottom portion having a second wavy fin configuration different from the first wavy fin configuration such that a surface area of the shield is about 1400 in$^2$ to about 1410 in$^2$.

In accordance with at least some embodiments, a substrate processing apparatus comprises a chamber body having a substrate support disposed therein, a target coupled to the chamber body opposite the substrate support, an RF power source to form a plasma within the chamber body, and a shield comprising an inner wall comprising an upper portion having a first wavy fin configuration and a bottom portion having a second wavy fin configuration different from the first wavy fin configuration such that a surface area of the shield is about 1400 in$^2$ to about 1410 in$^2$.

In accordance with at least some embodiments, a process kit for use in a physical vapor deposition chamber comprises a shield comprising an inner wall comprising an upper portion having a first wavy fin configuration and a bottom portion having a second wavy fin configuration different from the first wavy fin configuration such that a surface area of the shield is about 1400 in$^2$ to about 1400 in$^2$, wherein the second wavy fin configuration has a non-continuous generally sinusoidal configuration, and wherein the first wavy fin configuration has a generally V-shaped bottom portion extending away from the inner wall of the shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
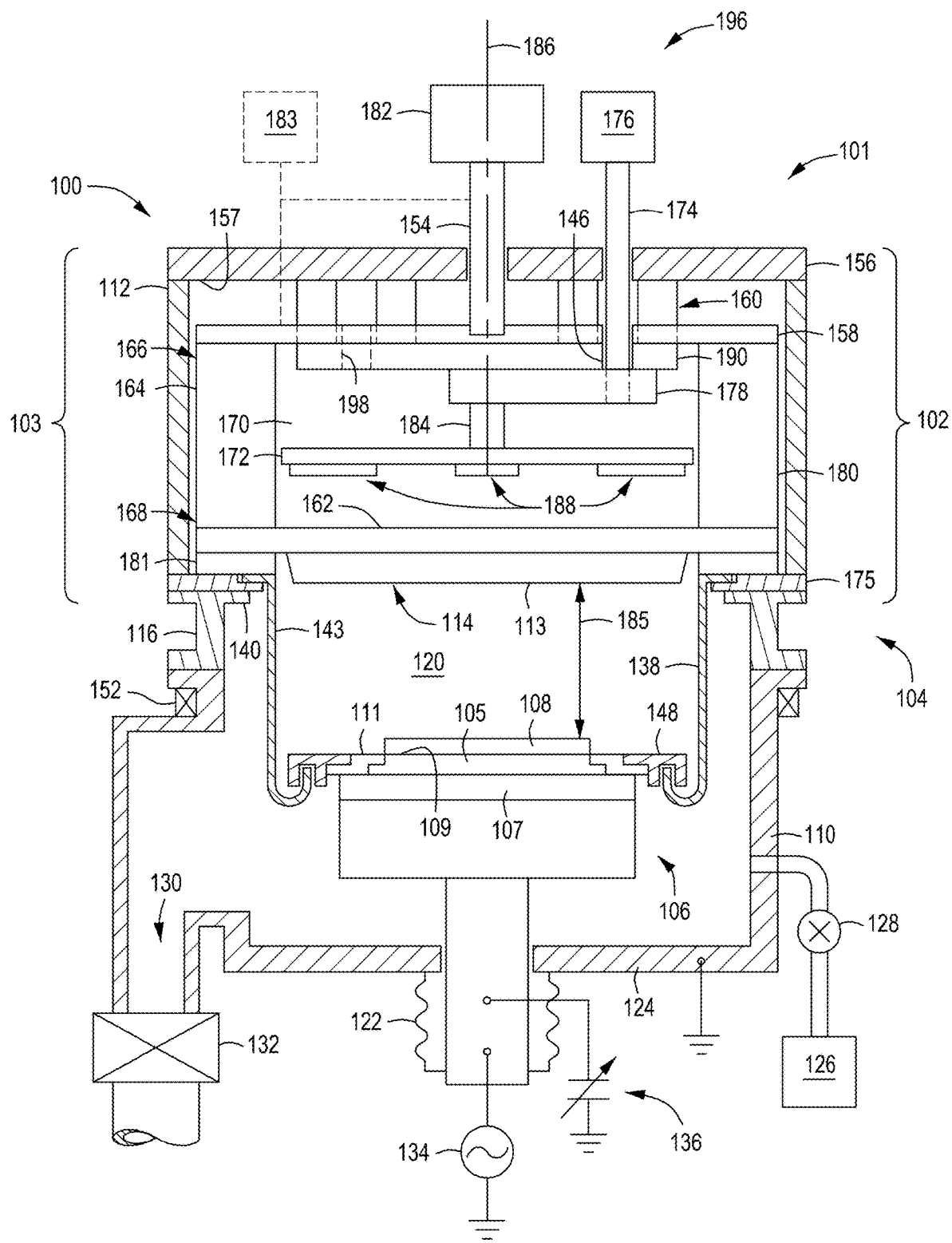
FIG. 1 is a schematic cross-sectional view of a processing chamber, in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for improved physical vapor deposition (PVD) processing equipment are provided herein. The PVD processes may advantageously be high density plasma assisted PVD processes, such as described below. In at least some embodiments of the present disclosure, the improved methods and apparatus provide a grounded shield for a PVD processing apparatus that may advantageously lower the potential difference to the grounded shield while maintaining target to substrate spacing, thereby facilitating PVD processing with reduced or eliminated re-sputtering of the grounded shield. For example, a shield comprising an inner wall comprising an upper portion having a first wavy fin configuration and a bottom portion having a second wavy fin configuration different from the first wavy fin configuration such that a surface area of the shield is about 1000 in$^2$ to about 1410 in$^2$. The surface area is defined as the inner surface area of the shield (e.g., inner surface area exposed to a processing volume of a processing chamber).

FIG. 1 is a schematic cross-sectional view of a processing chamber 100 (e.g., a substrate processing apparatus, such as a physical vapor deposition chamber) in accordance with some embodiments of the present disclosure. The specific configuration of the PVD chamber is illustrative and PVD chambers having other configurations may also benefit from modification in accordance with the teachings provided herein. Examples of suitable PVD chambers include any of the line of PVD processing chambers, commercially available from Applied Materials, Inc., of Santa Clara, Calif. Other processing chambers from Applied Materials, Inc. or other manufactures may also benefit from the inventive apparatus disclosed herein.

In some embodiments of the present disclosure, the processing chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the processing chamber 100. The substrate support 106 may be located within a lower grounded enclosure wall 110, which may be a wall of the chamber body 104. The lower grounded enclosure wall 110 may be electrically coupled to the grounding assembly 103 of the chamber lid 101 such that an RF return path is provided to an RF power source 182 disposed above the chamber lid 101. Alternatively, other RF return paths are possible, such as those that travel from the substrate support 106 via a process kit shield (e.g., a grounded shield (e.g., anode) and ultimately back to the grounding assembly 103 of the chamber lid 101. The RF power source 182 may provide RF energy to the target assembly 102 as discussed below.

The substrate support 106 has a material-receiving surface facing a principal surface of a target 114 (e.g., a cathode opposite the substrate support) and supports the substrate 108 to be sputter coated with material ejected from the target 114 in planar position opposite to the principal surface of the target 114. The substrate support 106 may include a dielectric member 105 having a substrate processing surface 109 for supporting the substrate 108 thereon. In some embodiments, the substrate support 106 may include one or more conductive members 107 disposed below the dielectric member 105. For example, the dielectric member 105 and the one or more conductive members 107 may be part of an electrostatic chuck, RF electrode, or the like which may be used to provide chucking or RF power to the substrate support 106.

The substrate support 106 may support the substrate 108 in a first volume 120 (processing volume) of the chamber body 104. The first volume 120 is a portion of the inner volume of the chamber body 104 that is used for processing the substrate 108 and may be separated from the remainder of the inner volume (e.g., a non-processing volume) during processing of the substrate 108 (for example, via a shield 138). The first volume 120 is defined as the region above the substrate support 106 during processing (for example, between the target 114 and the substrate support 106 when in a processing position).

In some embodiments, the substrate support 106 may be vertically movable to allow the substrate 108 to be transferred onto the substrate support 106 through an opening (such as a slit valve, not shown) in the lower portion of the chamber body 104 and thereafter raised to a processing position. A bellows 122 connected to a bottom chamber wall 124 may be provided to maintain a separation of the inner volume of the chamber body 104 from the atmosphere outside of the chamber body 104. One or more gases may be supplied from a gas source 126 through a mass flow controller 128 into the lower part of the chamber body 104. An exhaust port 130 may be provided and coupled to a pump (not shown) via a valve 132 for exhausting the interior of the chamber body 104 and to facilitate maintaining a desired pressure inside the chamber body 104.

An RF bias power source 134 may be coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or additionally, a capacitance tuner 136 may be coupled to the substrate support 106 for adjusting voltage on the substrate 108 for applications where RF bias power is not be desired.

The shield 138 (e.g., a grounded process kit shield) can be made of one or more suitable material including, but not limited to, aluminum alloy, stainless steel, and/or titanium. For example, in at least some embodiments, the shield 138 can be made from stainless steel. Additionally, the shield 138 can be fabricated using one or more fabrication processes. For example, in at least some embodiments, the shield 138 can be fabricated using one or more conventional 3-D printing processes. Alternatively, one or more other conventional processes can be used to fabricate the shield 138.

The shield 138 surrounds the first volume 120 of the chamber body 104 to protect other chamber components from damage and/or contamination from processing. In some embodiments, the shield 138 may be coupled to a ledge 140 of an upper grounded enclosure wall 116 of the chamber body 104. In other embodiments, and as illustrated in FIG. 1, the shield 138 may be coupled to the chamber lid 101, for example via a retaining ring (not shown).

The shield 138 comprises an inner wall 143 disposed between the target 114 and the substrate support 106. In at least some embodiments, the inner wall 143 is provided with an innermost diameter configured to surround the target 114 when disposed in the processing chamber 100. In at least some embodiments, a ratio of a surface area of the shield 138 to a planar area of the inner diameter is about 3 to about 10. The height of the shield 138 depends upon the substrate distances 185 between the target 114 and the substrate 108. For example, in at least some embodiments, substrate distances 185 between the target 114 and the substrate 108 can be about 69 mm. The substrate distances 185 between the target 114 and the substrate 108, and correspondingly, the height of the shield 138, can be scaled based on the diameter of the substrate 108. In some embodiments, the ratio of the diameter of the target 114 to the diameter of the substrate is about 1.4. For example, a processing chamber for processing a 300 mm substrate may have a target 114 having a diameter of about 419 mm or, in some embodiments, a processing chamber for processing a 450 mm substrate may have a target 114 having a diameter of about 625 mm. In some embodiments, the ratio of the diameter of the target 114 to the height of the shield 138 is about 4.1 to about 4.3, or in some embodiments, about 4.2. For example, in some embodiments of a processing chamber for processing a 300 mm substrate, the target 114 may have a diameter of about 419 mm and the shield 138 may have a height of about 100 mm or, in some embodiments of a processing chamber for processing a 450 mm substrate, the target 114 may have a diameter of about 625 mm and the shield 138 may have a height of about 150 mm. Other diameters and heights may also be used to provide the desired ratio. In processing chambers having the ratios described above the substrate distances 185 between the target 114 and the substrate 108 is about 50.8 mm to about 152.4 mm for a 300 mm substrate or about 101.6 mm to about 203.2 mm for a 450 mm substrate. A processing chamber having the above configurations is referred to herein as a "short throw" processing chamber.

The short throw processing chamber advantageously increases the deposition rate over processing chambers having longer target to substrate distances 185. For example, for some processes, conventional processing chambers having longer target to substrate distances 185 provide a deposition rate of about 1 to about 2 angstroms/second. In comparison, for similar processes in a short throw processing chamber, a deposition rate of about 5 to about 10 angstroms/second can be obtained while maintaining high ionization levels. In some embodiments, a processing chamber in accordance with embodiments of the present disclosure may provide a deposition rate of about 10 angstroms/second. High ionization levels at such short spacing can be obtained by providing a high pressure, for example, about 60 millitorr to about 140 millitorr, and a very high driving frequency, for example, from about 27 MHz to about 162 MHz, for example such as at about such readily commercially available frequencies as 27.12, 40.68, 60, 81.36, 100, 122, or 162.72 MHz.

Additionally, electrons have higher mobility than ions, and during their respective half cycles, both the electrodes (e.g., the cathode or powered electrode and the anode or grounded electrode) will quickly acquire electrons until the electrodes can no longer attract more of the electrons due to repulsion from accumulated electrons. During the negative half-cycle, both the electrodes will attract positive ions, however due to the lower mobility of ions, the electrodes will not neutralise all the electrons and will acquire a net negative bias relative to plasma.

The inventors have found that if the area of both the electrodes (cathode (target) and anode (shield, wafer, dep ring, cover ring, etc.)) is comparable, then the ions created in the plasma will be attracted towards both the electrodes in equal proportions during their respective negative half-cycles, which, in turn, would lead to sputtering of material from both the electrodes in comparable proportions. However, in RF sputter-deposition, the area of the target is usually preferred to be smaller (e.g., helps to enable more deposition and less etching on the anode side) than the area of the anode (shield, wafer, dep ring, cover ring, etc.), which, in turn, can lead to a higher magnitude of negative bias and, thus higher electric field to accelerate the ions towards the target. Accordingly, depending on an area of the target (cathode) relative to the shield (anode), there will either be deposition from the target (sputter-deposition) or there will be etching (re-sputtering) of the anode (wafer, shields, dep ring, etc.).

Re-sputtering of the shield 138 causes undesirable contamination within the processing chamber 100. The re-sputtering of the shield 138 is a result of the high voltage on the shield 138. The amount of voltage that appears on the target 114 (e.g., the cathode or powered electrode) and the grounded shield 138 (e.g., the anode or grounded electrode) is dependent on the ratio of the surface area of the shield 138 to the surface area of the target 114, as a greater voltage appears on the smaller electrode. Sometimes the surface area of the target 114 can be larger than the surface area of the shield 138 resulting in a greater voltage upon the shield 138, and in turn, resulting in the undesired re-sputtering of the shield 138. For example, in some embodiments of a processing chamber for processing a 300 mm substrate, the target may have a diameter of about 419 mm with a corresponding surface area of about 138 mm$^2$ and the shield 138 may have a height of about 100 mm with a corresponding surface area of about 132 mm$^2$ or, in some embodiments of a processing chamber for processing a 450 mm substrate, the target may have a diameter of about 625 mm with a corresponding surface area of about 307 mm$^2$ and the shield 138 may have a height of about 150 mm with a corresponding surface area of about 295 mm$^2$. The inventors have observed that in some embodiments of processing chambers where the ratio of the surface area of the shield 138 to the surface area of the target 114 is less than 1, a greater voltage is incurred upon the shield 138, which in turn, results in the undesired re-sputtering of the shield 138. Thus, in order to advantageously minimize or prevent the re-sputtering of the shield 138, the inventors have observed that the surface area of the shield 138 (e.g., an inner surface area exposed to a processing volume of a processing chamber) needs to be greater than the surface area of the target 114. For example, the inventors have observed that a ratio of the surface area of the shield 138 to the surface area of the target 114 of about 3 to about 10 advantageously minimizes or prevents the re-sputtering of the shield 138.

Additionally, the inventors have observed that a ratio of the surface area of the shield 138 to the surface area of the target 114 of about 3 to about 10 advantageously provides a relatively high negative self-biasing at the target 114. For example, the relatively high negative self-biasing at the target 114 attracts more positive plasma ions (e.g., argon ions) toward the target 114 during operation, which, in turn, increases target sputtering and decreases re-sputtering (e.g., etching) of the shield 138, a deposition ring (not shown), the substrate 108, or another component.

However, the surface area of the shield 138 cannot be increased by simply increasing the height of the shield 138 due to the desired ratio of the diameter of the target 114 to the height of the shield 138, as discussed above. The inventors have observed that, in some embodiments of a processing chamber having the processing conditions discussed above (e.g., process pressures and RF frequencies used), the ratio of the surface area of the shield 138 to the height of the shield 138 must be about 2 to about 3 to advantageously minimize or prevent the re-sputtering of the shield 138. Furthermore, the diameter of the shield 138 cannot be increased sufficiently to increase the surface area of the shield 138 to prevent re-sputtering of the shield 138 due to physical constraint in the size of the processing chamber. For example, an increase in the diameter of the shield 138 of 25.4 mm results in a surface area increase of only 6%, which is insufficient to prevent the re-sputtering of the shield 138.

Figure 2:
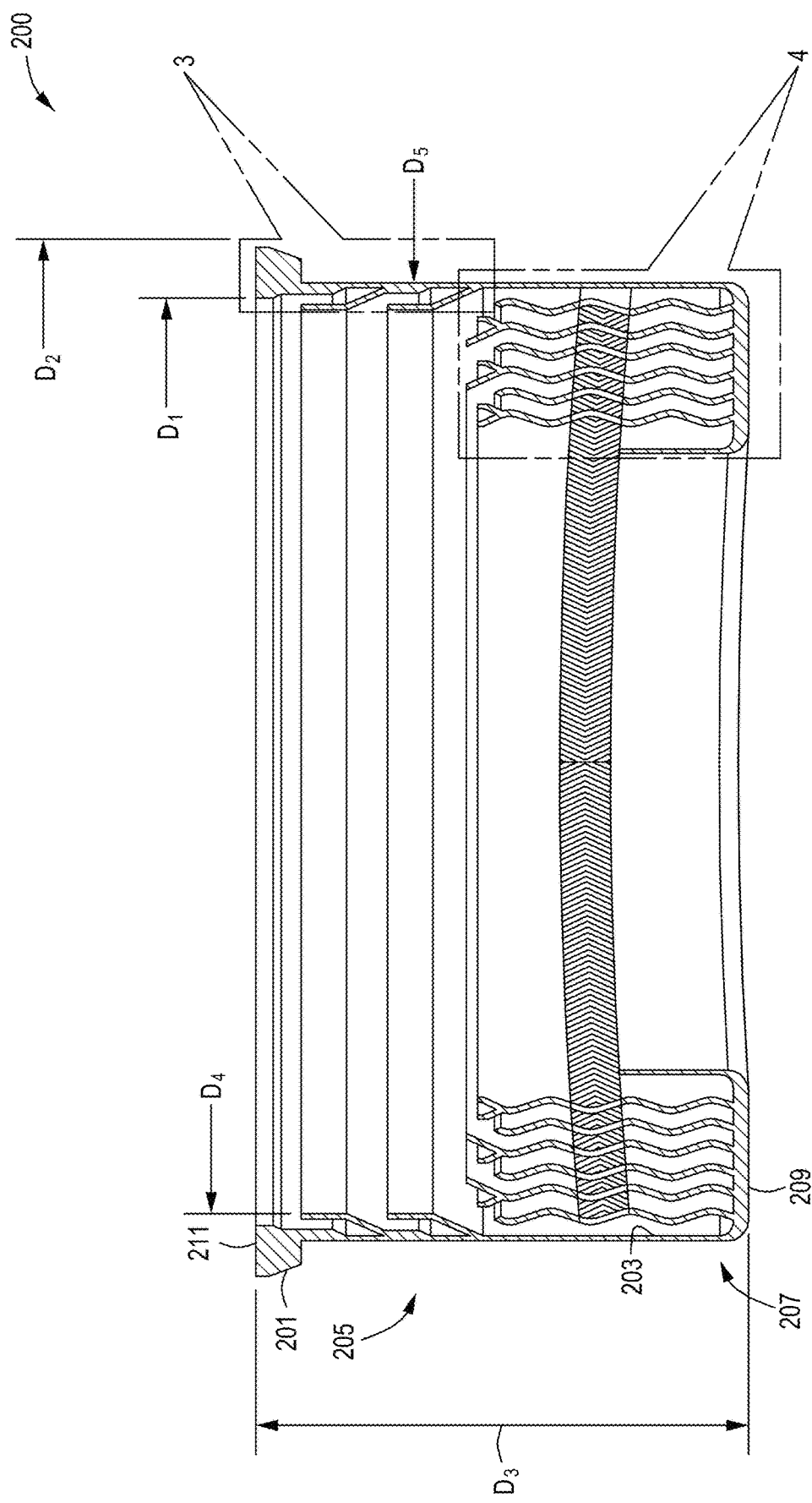
FIG. 2 is a sectional view of a shield, in accordance with some embodiments of the present disclosure.
Figure 4:
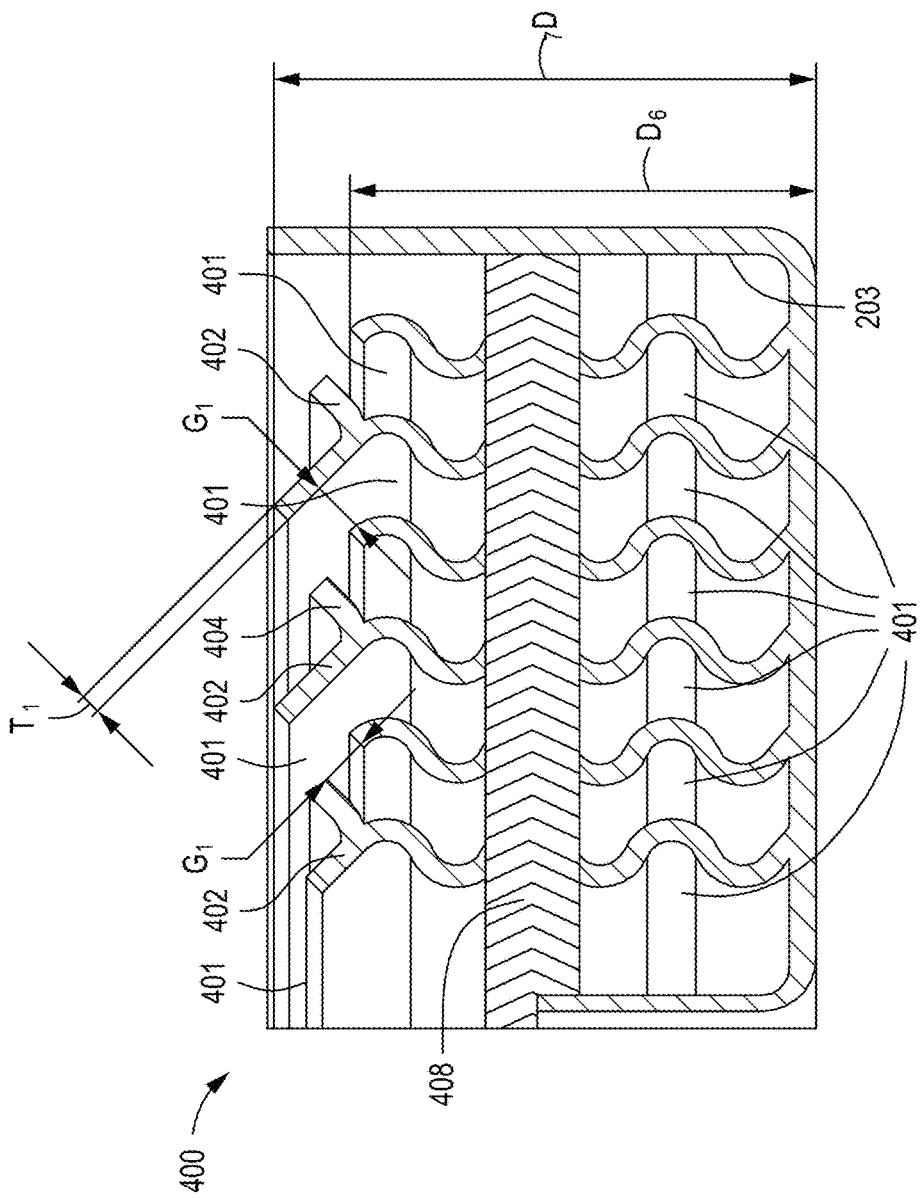
FIG. 4 is an enlarged view of the indicated area of detail of FIG. 2, in accordance with some embodiments of the present disclosure.
Figure 3:
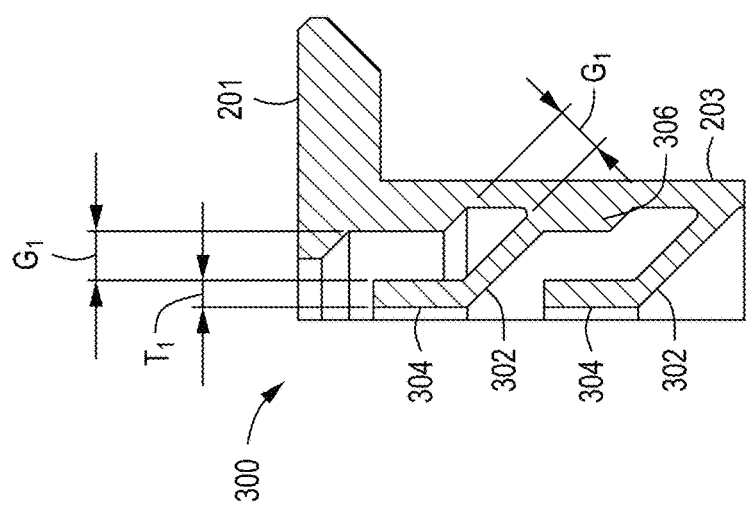
FIG. 3 is an enlarged view of the indicated area of detail of FIG. 2, in accordance with some embodiments of the present disclosure.

FIG. 2 is a sectional view of a shield 200, FIG. 3 is an enlarged view of the indicated area of detail of FIG. 2, and FIG. 4 is an enlarged view of the indicated area of detail of FIG. 2, in accordance with some embodiments of the present disclosure. For example, as depicted in FIG. 2, in order to obtain the desired ratio of the surface area of a shield to the surface area of a target, the shield 200, which is configured for use with the processing chamber 100, includes an inner wall 203 with an innermost diameter D1 configured to surround a target when disposed in the processing chamber 100. For example, the innermost diameter D1 can be greater than a diameter of a target. In at least some embodiments, the innermost diameter D1, which is measured from a flange 201 of the shield 200, can be about 14.5 inches to about 14.75 inches, e.g., 14.6 inches. Similarly, in at least some embodiments, an outermost diameter D2, also measured from the flange 201, can be about 16 inches to about 16.5 inches, e.g., 16.25 inches. The flange 201 is adjacent the upper portion of the inner wall 203 and is configured to rest on or couple to a support member of the processing chamber 100, as described in greater detail below. Additionally, in at least some embodiments, a distance D$_3$ from a bottom surface 209 of a bottom portion 207 of the shield 200 to a top surface 211 of the flange 201 is about 3 inches to about 3.5 inches, e.g., 3.25 inches.

Additionally, to achieve a larger area of anode, the inner wall 203 comprises the upper portion 205 having a first wavy fin configuration 300 (FIG. 3) and the bottom portion 207 having a second wavy fin configuration 400 (FIG. 4) different from the first wavy fin configuration 300. Having the wavy fin configurations as depicted in FIGS. 2-4 facilitates providing a shield with surface area of about 1000 in$^2$ to about 1410 in² (e.g., about 1400 in² to about 1404 in²), thus providing a geometry that allows for deposition of highly insulating dielectric targets by increasing the negative self-bias on the target.

The shield 138 and the first wavy fin configuration 300 and the second wavy fin configuration 400 can be monolithically fabricated using, for example, the 3-D printing process. Alternatively, the shield 138 can be formed using one or more fabrication processes other than the 3-D printing process and the first wavy fin configuration 300 and the second wavy fin configuration 400 can be fabricated using the 3-D printing process and subsequently attached to the shield 138 using one or more coupling apparatus, e.g., nuts, bolts, screws, soldering, etc.

For example, the first wavy fin configuration 300 has a generally V-shaped bottom portion 302 that connects to the inner wall 203 and a perpendicular top portion 304. The V-shaped bottom portion 302 and perpendicular top portion 304 define a fin of the first wavy fin configuration that extends along the inner wall 203. In at least some embodiments, the first wavy fin configuration 300 has a diameter $D_4$, which is measured from the perpendicular top portion 304, of about 14 inches to about 14.50 inches, e.g., 14.25 inches, and a diameter $D_5$, which is measured where the V-shaped bottom portion 302 connects to the inner wall 203, of about 15 inches to about 15.25 inches, e.g., 15.15 inches, see FIG. 2 for example.

The inner wall 203 of the shield 200 can have one or more fins of the first wavy fin configuration 300 disposed therealong. For example, in the illustrated embodiment, the inner wall 203 is shown comprising two (upper and lower) fins that are vertically aligned with each other. Each of the two fins can be substantially identical to each other. For example, an upper fin and a lower fin of the first wavy fin configuration 300 can have an identical perpendicular top portion 304 and a different V-shaped bottom portion 302 to facilitate fabricating the first wavy fin configuration 300. For example, in at least some embodiments, the upper fin of the of the first wavy fin configuration 300 can have an extension 306 that connects to the inner wall 203 and the lower fin of the of the first wavy fin configuration 300 can have a V-shaped bottom portion 302 that directly connects to the inner wall 203 (see FIG. 3 for example).

The second wavy fin configuration 400 has a plurality of fins having a generally sinusoidal configuration 401 with alternating generally V-shaped ends 402. The generally V-shaped ends 402 can have the same general configuration. For example, in the illustrated embodiment, the generally V-shaped ends 402 can comprise two diverging ends. For example, the generally V-shaped ends 402 can comprise a first portion 404 extending toward the inner wall 203 and a second portion 406 extending away from the inner wall 203. The first portion 404 and the second portion 406 can have the same length or different lengths. For example, in the illustrated embodiment, a V-shaped end disposed closest to where the shield 200 connects to a cover ring of the processing chamber 100 can have the first portion 404 and the second portion 406 with the same length and the remaining V-shaped ends can have the first portion 404 and the second portion 406 with different lengths.

The second wavy fin configuration 400 can have a continuous or non-continuous configuration. For example, in at least some embodiments, the second wavy fin configuration 400 has a non-continuous configuration. For example, an annular groove 408 can extend along the generally sinusoidal configuration 401 of the second wavy fin configuration 400. The annular groove 408 can have one or more suitable shapes, e.g., curved, straight, etc. For example, the annular groove 408 can have a generally diamond or triangular shape. In at least some embodiments, the annular groove can have a plurality of diamond shape cut-outs.

A distance $D_6$ from the bottom surface 209 of the shield 200 to a top portion of a fin without the V-shaped end can be about 1.6 inches. Similarly, a distance $D_7$ from the bottom surface 209 of the shield 200 to a top portion of a fin with the V-shaped end can be about 1.8 inches.

A thickness $T_1$ of each fin of the first wavy fin configuration 300 and the second wavy fin configuration 400 of about 0.08 inches. A gap $G_1$ between each of fin of the first wavy fin configuration 300 and the second wavy fin configuration 400 can be about 0.175 inches.

The inventors have found that providing the distances $D_1$-$D_7$, thickness $T_1$, and gap $G_1$ as described herein diminishes, if not eliminates, a cavity effect that is, typically, associated with conventional shield assemblies. That is, by providing each fin of the first wavy fin configuration 300 and the second wavy fin configuration 400 with the described herein dimensions essentially hides the shield (anode) from a line of sight of deposition from the target.

Returning to FIG. 1, the chamber lid 101 rests on the ledge 140 of the upper grounded enclosure wall 116. Similar to the lower grounded enclosure wall 110, the upper grounded enclosure wall 116 may provide a portion of the RF return path between the upper grounded enclosure wall 116 and the grounding assembly 103 of the chamber lid 101. However, other RF return paths are possible, such as via the grounded shield 138.

As discussed above, the shield 138 extends downwardly and may include one or more sidewalls configured to surround the first volume 120. The shield 138 extends along, but is spaced apart from, the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138).

A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition.

An additional dielectric ring 111 may be used to shield the periphery of the substrate 108 from deposition. For example, the additional dielectric ring 111 may be disposed about a peripheral edge of the substrate support 106 and adjacent to the substrate processing surface 109, as illustrated in FIG. 1.

The first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 138 when the first ring 148 is moved into the second position as the substrate support is moved into the processing position. For example, a substrate support facing surface of the innermost protrusion may be tapered, notched or the like to rest in/on a corresponding surface on the substrate support 106 when the first ring 148 is in the second position.

In some embodiments, a magnet 152 may be disposed about the chamber body 104 for selectively providing a magnetic field between the substrate support 106 and the target 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 may include a grounding plate 156 having a first surface 157 that may be generally parallel to and opposite a backside of the target assembly 102. A grounding shield 112 may extend from the first surface 157 of the grounding plate 156 and surround the target assembly 102. The grounding assembly 103 may include a support member 175 to support the target assembly 102 within the grounding assembly 103.

In some embodiments, the support member 175 may be coupled to a lower end of the grounding shield 112 proximate an outer peripheral edge of the support member 175 and extends radially inward to support a seal ring 181, the target assembly 102 and optionally, a dark space shield (e.g., that may be disposed between the shield 138 and the target assembly 102, not shown). The seal ring 181 may be a ring or other annular shape having a desired cross-section to facilitate interfacing with the target assembly 102 and with the support member 175. The seal ring 181 may be made of a dielectric material, such as ceramic. The seal ring 181 may insulate the target assembly 102 from the ground assembly 103.

The support member 175 may be a generally planar member having a central opening to accommodate the shield 138 and the target 114. In some embodiments, the support member 175 may be circular, or disc-like in shape, although the shape may vary depending upon the corresponding shape of the chamber lid and/or the shape of the substrate to be processed in the processing chamber 100. In use, when the chamber lid 101 is opened or closed, the support member 175 maintains the shield 138 in proper alignment with respect to the target 114, thereby minimizing the risk of misalignment due to chamber assembly or opening and closing the chamber lid 101.

The target assembly 102 may include a source distribution plate 158 opposing a backside of the target 114 and electrically coupled to the target 114 along a peripheral edge of the target 114. The target 114 may comprise a source material 113 to be deposited on a substrate, such as the substrate 108 during sputtering, such as a metal, metal oxide, metal alloy, magnetic material, or the like. In some embodiments, the target 114 may include a backing plate 162 to support the source material 113. The backing plate 162 may comprise a conductive material, such as copper-zinc, copper-chrome, or the same material as the target, such that RF, and optionally DC, power can be coupled to the source material 113 via the backing plate 162. Alternatively, the backing plate 162 may be non-conductive and may include conductive elements (not shown) such as electrical feedthroughs or the like.

A conductive member 164 may be disposed between the source distribution plate and the backside of the target 114 to propagate RF energy from the source distribution plate to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate facing surface of the backing plate 162 proximate the peripheral edge of the backing plate 162.

The target assembly 102 may include a cavity 170 disposed between the backside of the target 114 and the source distribution plate 158. The cavity 170 may at least partially house a magnetron assembly 196. The cavity 170 is at least partially defined by the inner surface of the conductive member 164, a target facing surface of the source distribution plate 158, and a source distribution plate facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion, as shown) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 should be between about 5 to about 40 mm.

The grounding assembly 103 and the target assembly 102 may be electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 162 MHz or above. For example, non-limiting frequencies such as 13.56 MHz, 27.12 MHz, 60 MHz, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the processing chamber 100 (e.g., the electrode 154 may be coupled to the target assembly at a point coincident with a central axis of the target, which is coincident with the central axis 186). The electrode 154, aligned with the central axis 186 of the processing chamber 100, facilitates applying RF energy from the RF power source 182 to the target 114 in an asymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like.

The electrode 154 may pass through an opening in the grounding plate 156 and is coupled to a source distribution plate 158. The grounding plate 156 may comprise any suitable conductive material, such as aluminum, copper, or the like. Open spaces between the one or more insulators 160 allow for RF wave propagation along the surface of the source distribution plate 158. In some embodiments, the one or more insulators 160 may be symmetrically positioned with respect to the central axis 186 of the processing chamber 100 Such positioning may facilitate symmetric RF wave propagation along the surface of the source distribution plate 158 and, ultimately, to a target 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the processing chamber 104. In some embodiments, the magnetron assembly 196 may include a motor 176, a motor shaft 174, a gear box 178, a gear box shaft 184, and a rotatable magnet (e.g., a plurality of magnets 188 coupled to a magnet support member 172).

The magnetron assembly 196 is rotated within the cavity 170. For example, in some embodiments, the motor 176, motor shaft 174, gear box 178, and gear box shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as sensors or the like.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188). The gear box shaft 184 may advantageously be coincident with the central axis 186 of the processing chamber 100.

The magnet support member 172 may be constructed from any material suitable to provide adequate mechanical strength to rigidly support the plurality of magnets 188. The plurality of magnets 188 may be configured in any manner to provide a magnetic field having a desired shape and strength to provide a more uniform full-face erosion of the target as described herein.

Alternatively, the magnet support member 172 may be rotated by any other means with sufficient torque to overcome the drag caused on the magnet support member 172 and attached plurality of magnets 188, for example due to the cooling fluid, when present, in the cavity 170.

While the foregoing is directed to embodiments of the present disclosure, other and further embodiments of the disclosure may be devised without departing from the basic scope thereof.

The invention claimed is:

1. A shield for use in a physical vapor deposition chamber, comprising:
   an inner wall comprising a bottom portion having a plurality of wavy fins with a generally sinusoidal configuration,
   wherein an annular groove extends along each fin of the plurality of wavy fins, or at least one fin of the plurality of wavy fins has a generally V-shaped end.

2. The shield of claim 1, further comprising a flange disposed adjacent an upper portion of the inner wall and having an inner diameter of about 14.5 inches to about 14.75 inches and an outer diameter of about 16 inches to about 16.5 inches.

3. The shield of claim 2, wherein a distance from a bottom surface of the bottom portion to a top surface of the flange is about 3 inches to about 3.5 inches.

4. The shield of claim 1, wherein a thickness of each fin of the plurality of wavy fins is about 0.08 inches.

5. The shield of claim 1, wherein a gap between each fin of the plurality of wavy fins is about 0.175 inches.

6. The shield of claim 1, wherein the annular groove is one of curved or straight.

7. The shield of claim 6, wherein the annular groove is one of diamond shaped or triangular shaped.

8. The shield of claim 1, wherein the plurality of wavy fins are vertically aligned along the bottom portion.

9. The shield of claim 1, wherein the inner wall comprises an upper portion having a first wavy fin configuration, and the plurality of wavy fins in the bottom portion have a second wavy fin configuration different from the first wavy configuration.

10. A substrate processing apparatus, comprising:
 a chamber body having a substrate support disposed therein;
 a target coupled to the chamber body opposite the substrate support;
 an RF power source to form a plasma within the chamber body; and
 a shield comprising an inner wall comprising a bottom portion having a plurality of wavy fins with a generally sinusoidal configuration,
 wherein an annular groove extends along each fin of the plurality of wavy fins, or at least one fin of the plurality of wavy fins has a generally V-shaped end.

11. The substrate processing apparatus of claim 10, further comprising a flange disposed adjacent an upper portion of the inner wall and having an inner diameter of about 14.5 inches to about 14.75 inches and an outer diameter of about 16 inches to about 16.5 inches.

12. The substrate processing apparatus of claim 11, wherein a distance from a bottom surface of the bottom portion to a top surface of the flange is about 3 inches to about 3.5 inches.

13. The substrate processing apparatus of claim 10, wherein a thickness of each fin of the plurality of wavy fins is about 0.08 inches.

14. The substrate processing apparatus of claim 10, wherein a gap between each fin of the plurality of wavy fins is about 0.175 inches.

15. The substrate processing apparatus of claim 10, wherein the plurality of wavy fins are vertically aligned along the bottom portion.

16. The substrate processing apparatus of claim 10, wherein the inner wall comprises an upper portion having a first wavy fin configuration, and the plurality of wavy fins in the bottom portion have a second wavy fin configuration different from the first wavy configuration.

* * * * *